(12) United States Patent
Chen et al.

(10) Patent No.: US 9,178,143 B2
(45) Date of Patent: Nov. 3, 2015

(54) RESISTIVE MEMORY STRUCTURE

(71) Applicant: Industrial Technology Research Institute, Hsinchu (TW)

(72) Inventors: Frederick T. Chen, Hsinchu County (TW); Pei-Yi Gu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 13/952,678

(22) Filed: Jul. 29, 2013

(65) Prior Publication Data
US 2015/0028281 A1 Jan. 29, 2015

(51) Int. Cl.
*G11C 11/00* (2006.01)
*H01L 45/00* (2006.01)

(52) U.S. Cl.
CPC .......... *H01L 45/1253* (2013.01); *H01L 45/145* (2013.01)

(58) Field of Classification Search
CPC ...................................................... G11C 11/00
USPC ............. 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

| | | | |
|---|---|---|---|
| 7,064,056 B2 | 6/2006 | Thei et al. | |
| 7,470,992 B2 | 12/2008 | Thei et al. | |
| 7,598,563 B2 | 10/2009 | Kim | |
| 8,164,176 B2 | 4/2012 | Siepe et al. | |
| 2003/0117831 A1* | 6/2003 | Hush | 365/148 |
| 2006/0221663 A1* | 10/2006 | Roehr | 365/148 |
| 2008/0239788 A1* | 10/2008 | Markert et al. | 365/148 |
| 2009/0309089 A1* | 12/2009 | Hsia et al. | 257/5 |
| 2010/0027318 A1* | 2/2010 | Nagashima et al. | 365/148 |
| 2010/0054017 A1* | 3/2010 | Maejima | 365/148 |
| 2010/0159675 A1 | 6/2010 | Jeong et al. | |
| 2011/0007544 A1* | 1/2011 | Vaithyanathan et al. | 365/148 |
| 2011/0080766 A1* | 4/2011 | Chang et al. | 365/148 |
| 2011/0140067 A1 | 6/2011 | Chen et al. | |

(Continued)

FOREIGN PATENT DOCUMENTS

| | | |
|---|---|---|
| TW | 200822295 | 5/2008 |
| TW | 200921847 | 5/2009 |
| TW | 201006020 | 2/2010 |

OTHER PUBLICATIONS

Frederick T. Chen et al., U.S. Appl. No. 13/615,683, filed Sep. 14, 2012, pp. 1-34.

(Continued)

*Primary Examiner* — Harry W Byrne
(74) *Attorney, Agent, or Firm* — Jianq Chyun IP Office

(57) ABSTRACT

A resistive memory structure including at least one reactive layer, at least one electrode, and at least one resistance-changing material is provided. The reactive layer extends along a first direction and a second direction. The electrode extends at least along a third direction, wherein the first direction, the second direction, and the third direction are different from each other. At least part of the resistance-changing material is disposed between the reactive layer and the electrode. When ions diffuse from the resistance-changing material to the reactive layer or from the reactive layer to the resistance-changing material, resistance of the resistance-changing material changes.

20 Claims, 11 Drawing Sheets

(56) References Cited

U.S. PATENT DOCUMENTS

| | | |
|---|---|---|
| 2011/0242875 A1* | 10/2011 | Nagashima et al. .......... 365/148 |
| 2011/0260288 A1 | 10/2011 | Sukekawa et al. |
| 2011/0316160 A1 | 12/2011 | Siepe et al. |
| 2012/0044747 A1* | 2/2012 | Chung .......................... 365/148 |
| 2012/0069627 A1* | 3/2012 | Minemura et al. ............ 365/148 |
| 2012/0236624 A1* | 9/2012 | Costa et al. ................... 365/148 |
| 2012/0250395 A1* | 10/2012 | Nodin ........................... 365/148 |

OTHER PUBLICATIONS

Chung et al, "Novel 4F2 DRAM Cell with Vertical Pillar Transistor(VPT)," Solid-State Device Research Conference (ESSDERC), Proceedings of the European, Sep. 12-16, 2011, pp. 211-214.

Chen et al., "Highly Scalable Hafnium Oxide Memory with Improvements of Resistive Distribution and Read Disturb Immunity," Electron Devices Meeting (IEDM), IEEE International, Dec. 7-9, 2009, pp. 1-4.

Choi et al., "A Novel 3D Cell Array Architecture for Terra-bit NAND Flash Memory," Memory Workshop (IMW), 3rd IEEE International, May 22-25, 2011, pp. 1-4.

H. Tanaka et al., "Bit Cost Scalable Technology with Punch and Plug Process for Ultra High Density Flash Memory," IEEE Symposium on VLSI Technology, Jun. 12-14, 2007, pp. 14-15.

Lue et al., "A Highly Scalable 8-Layer 3D Vertical-Gate (VG) TFT NAND Flash Using Junction-Free Buried Channel BE-SONOS Device," Symposium on VLSI Technology (VLSIT), Jun. 15-17, 2010, pp. 131-132.

* cited by examiner

RESISTIVE MEMORY STRUCTURE

TECHNICAL FIELD

The technical field relates to a resistive memory structure.

BACKGROUND

Memory devices developed based on semiconductor techniques, such as dynamic random access memory (DRAM), static random access memory (SRAM), and non-volatile memory, have taken a major part in today's semiconductor industry. These memories have been broadly applied to personal computers, mobile phones, and networks and have become one of the most indispensable electronic products in our daily life.

The demand to memories having low power consumption, low cost, high access speed, small volume, and high capacity has been increasing drastically along with the widespread of consumable electronic products and system products. Among existing memories, the memory which records data by changing the resistance of a variable-resistance layer is one of the most focused memory devices.

In a resistive random access memory (RRAM), the state of a variable resistance layer is changed by applying a current pulse and a conversion voltage, so as to switch between a set state and a reset state according to different resistances. The digital data "0" and "1" is recorded in the memory according to the set and reset states corresponding to different resistances.

SUMMARY

One of exemplary embodiments provides a resistive memory structure comprising at least one reactive layer, at least one electrode, and at least one resistance-changing material. The reactive layer extends along a first direction and a second direction. The electrode extends at least along a third direction, wherein the first direction, the second direction, and the third direction are different from each other. At least part of the resistance-changing material is disposed between the reactive layer and the electrode. When ions diffuse from the resistance-changing material to the reactive layer or from the reactive layer to the resistance-changing material, resistance of the resistance-changing material changes.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1B:
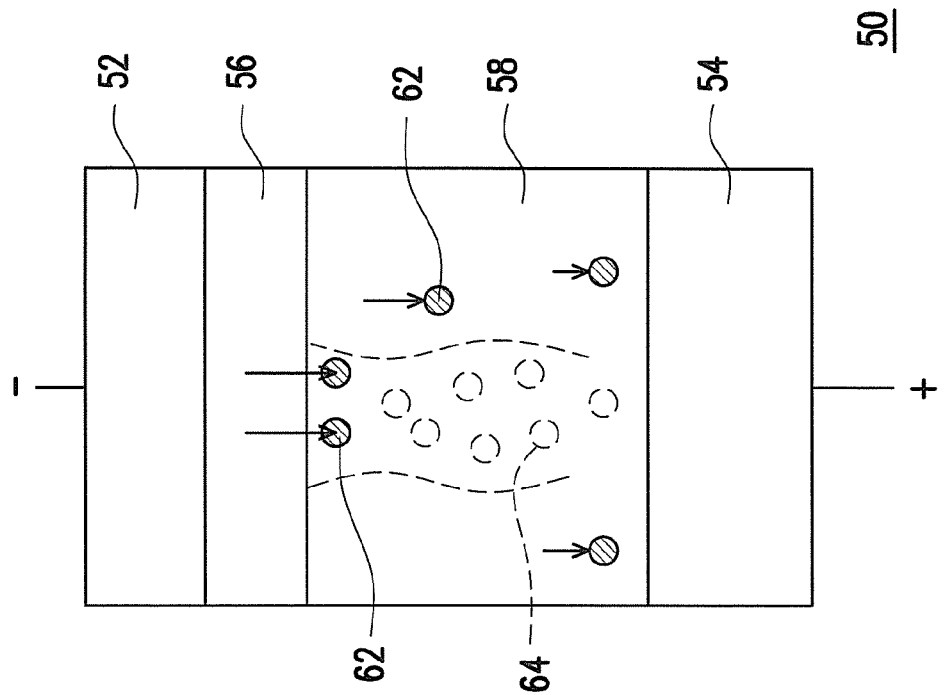
FIGS. 1A and 1B respectively show a set state and a reset state of a resistive random access memory (RRAM) structure according to an exemplary embodiment.
Figure 1A:
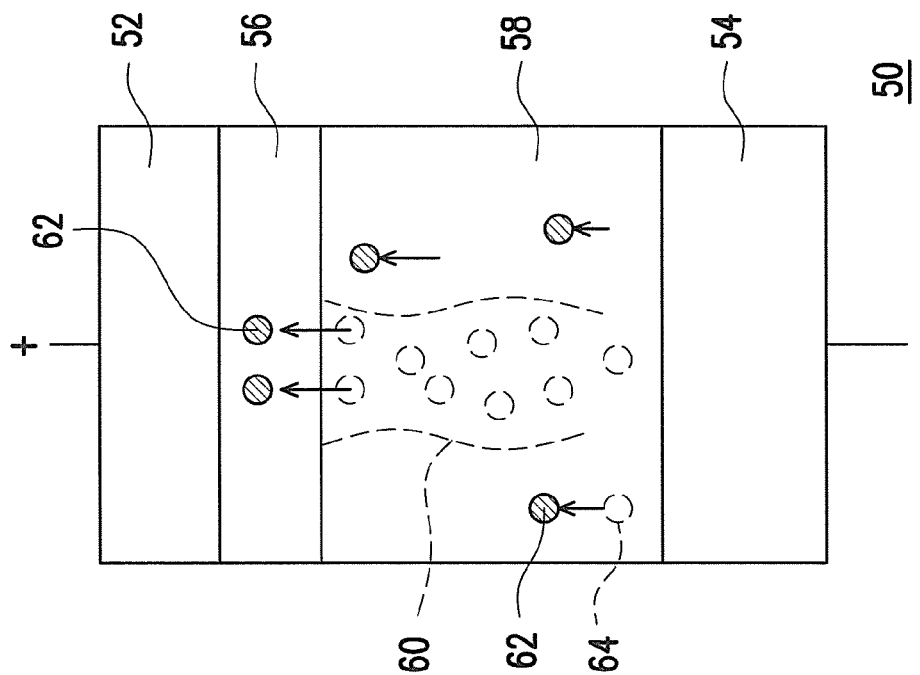

FIGS. 1A and 1B respectively show a set state and a reset state of a resistive random access memory (RRAM) structure according to an exemplary embodiment. Referring to FIGS. 1A and 1B, the RRAM structure 50 in this embodiment comprises a first electrode 52, a second electrode 54, an ion getter 56, and a resistance-changing layer 58. The resistance-changing layer 58 is disposed between the first electrode 52 and the second electrode 54. In this embodiment, the ion getter 56 is disposed between the first electrode 52 and the resistance-changing layer 58. However, in other embodiments, the ion getter 56 may be disposed between the second electrode 54 and the resistance-changing layer 58.

In this embodiment, the material of the resistance-changing layer 58 is, for example, an oxide, and the material of the ion getter 56 may be a material capable of absorbing oxygen ions. As shown in FIG. 1A, when a set voltage difference is applied to the first electrode 52 and the second electrode 54 and when the voltage of the first electrode 52 is greater than that of the second electrode 54, some ions 62 (e.g. oxygen ions) diffuse from the resistance-changing layer 58 to the ion getter 56. In other words, the ions 62 are absorbed by the ion getter 56. When the ions 62 leave their original positions in the resistance-changing layer 58, vacancies 64 at these positions occur. These vacancies 64 reduce the resistance of the resistance-changing layer 58. As a result, a percolating conducting path (i.e. filament 60) is formed in the resistance-changing layer 58. On the other hand, as shown in FIG. 1B, when a reset voltage difference is applied to the first electrode 52 and the second electrode 54 and when the voltage of the first electrode 52 is less than the second electrode 54, the ions 62 absorbed by the ion getter 56 diffuse from the ion getter 56 to the resistance-changing layer 58 and are recombined with the vacancies 64. As a result, the filament 60 is ruptured, and the resistance of the resistance-changing layer 58 increases. Therefore, when the filament 60 is formed, the resistance-changing layer 58 is in a low resistance state. When the filament 60 is ruptured, the resistance-changing layer 58 is in a high resistance state. When a read-out voltage difference is applied to the first electrode 52 and the second electrode 54, the resistance of the resistance-changing layer 58 may be read-out, and whether the resistance-changing layer 58 is in the high resistance state or in the low resistance state is determined. One of the high resistance state and the low resistance state serves as a digital data "0", and the other serves as a digital data "1".

Figure 2A:
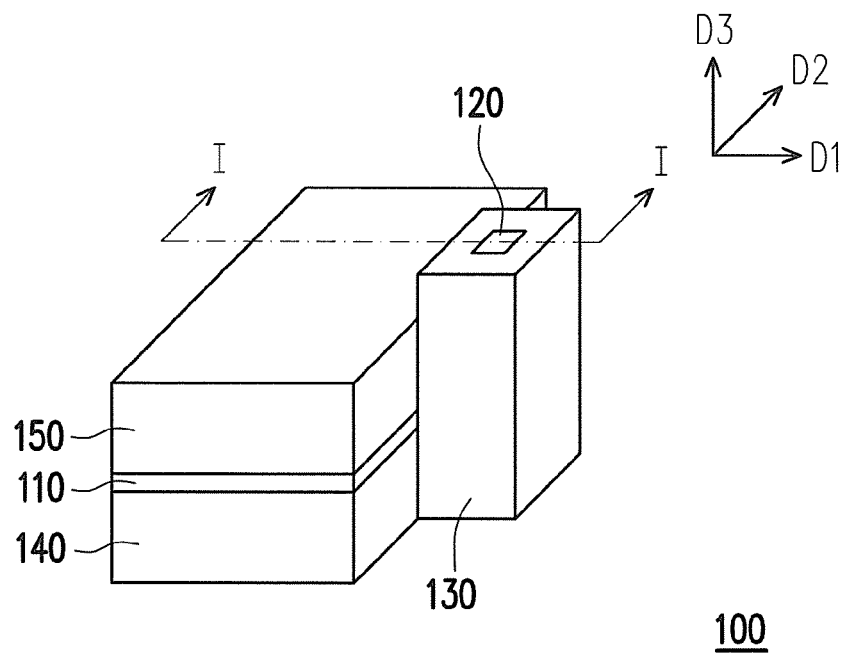
FIG. 2A is a schematic perspective view of a part of a resistive memory structure according to an exemplary embodiment.
Figure 2B:
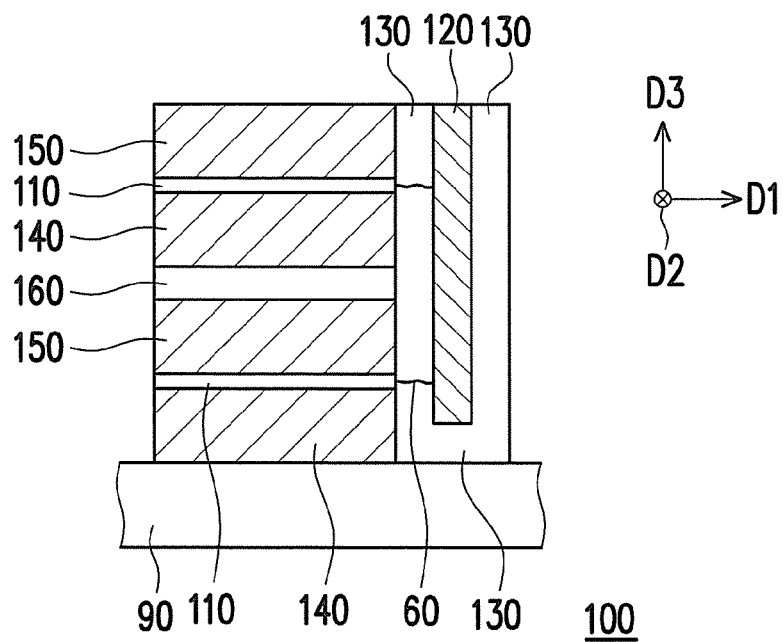
FIG. 2B is a schematic cross-sectional view of the resistive memory structure in FIG. 2C alone line I-I.

FIG. 2A is a schematic perspective view of a part of a resistive memory structure according to an exemplary embodiment, and FIG. 2B is a schematic cross-sectional view of the resistive memory structure in FIG. 2A alone line I-I. For the sake of simplicity, the substrate 90 in FIG. 2B are not shown in FIG. 2A. Referring to FIGS. 2A and 2B, the resistive memory structure 100 in this embodiment comprises at least one reactive layer 110, at least one electrode 120, and at least one resistance-changing material 130. In FIGS. 2A and 2B, a plurality of reactive layers 110, one electrode 120, and one resistance-changing material 130 are taken as an example. The reactive layer 110 extends along a first direction D1 and a second direction D2. In this embodiment, the reactive layer 110 extends along a plane containing the first direction D1 and the second direction D2. The electrode 120 extends along a third direction D3, wherein the first direction D1, the second direction D2, and the third direction D3 are different from each other. In this embodiment, the first direction D1, the second direction D2, and the third direction D3 are substantially perpendicular to each other. At least part of the resistance-changing material 130 is disposed between the reactive layer 110 and the electrode 120. When ions, for example, the ions 62 shown in FIGS. 1A and 1B (i.e. the oxygen ions) diffuse from the resistance-changing material 130 to the reactive layer 110 or from the reactive layer 110 to the resistance-changing material 130, the resistance of the resistance-changing material 130 changes.

Specifically, in this embodiment, the resistance-changing material 130 is an oxide. For example, the resistance-changing material 130 comprises $HfO_2$, $SiO_2$, $TiO_2$, TaO, $Al_2O_3$, or a combination thereof. In this embodiment, the resistance-changing material is $HfO_x$, wherein x>0. In addition, the reactive layer may be an oxygen ion getter. In this embodiment, the reactive layer is a reactive metal layer. For example, the material of the reactive metal layer comprises Ti, Ta, or a combination thereof. Moreover, the reactive layers 110 may be included among a plurality of metal layers. In this embodiment, the resistive memory structure 100 further comprises a plurality of metal layers (For example, the metal layer 140 and the metal layer 150 shown in FIGS. 2A and 2B), wherein the reactive layer 110 is sandwiched between the metal layers 140 and 150, and the metal layers 140 and 150 are more inert than the reactive layer 110. In this embodiment, the metal layers 140 and 150 are inert to oxygen, but the reactive layer 110 is reactive to oxygen. In this embodiment, the material of the metal layers 140 and 150 comprises Ti, TiN, TaN, W, Al, Ta or a combination thereof. In this embodiment, the material of the electrode 120 comprises TiN, W, Ti, or a combination thereof.

When a set voltage difference is applied to the metal layer 140 or 150 and the electrode 120, and the voltage of the reactive layer 110 is greater than the voltage of the electrode 120, the ions (e.g. oxygen ions) in the resistance-changing material 130 diffuse to the reactive layer 110 so that vacancies are formed in the resistance-changing material 130. As a result, a filament 60 as that shown in FIGS. 1A and 1B is formed in the resistance-changing material 130, so that the resistance of the resistance-changing material 130 is reduced. On the other hand, when a reset voltage difference is applied to the metal layer 140 or 150 and the electrode 120, and the voltage of the reactive layer 110 is less than the voltage of the electrode 120, the ions (e.g. oxygen ions) absorbed by the reactive layer diffuse back to the resistance-changing material 130 to recombine with the vacancies. As a result, the filament 60 is ruptured, and the resistance of the resistance-changing material 130 is increased.

In this embodiment, the metal layer 150 or the metal layer 140 may serve as a bit line, and the electrode 120 may serve as a page line. The sandwich structures each comprising a metal layer 140, a reactive layer 110, and a metal layer 150 may be stacked along a direction parallel to the extension direction of the electrode 120. Portions of the resistance-changing material 130 between the reactive layers 110 of the structures and the electrode 120 respectively form a plurality of memory units for storing data in the resistance form. In addition, an insulation layer 160 may be disposed between and isolate two adjacent sandwich structures.

In the resistive memory structure 100 according to this embodiment, since the electrode 120 and the reactive layer 110 extend along different directions, the portion of the resistance-changing material 130 where the electrode 120 crosses over the reactive layer 110 has a small area. As a result, a single filament 60 may be formed in the resistance-changing material 130, so that the decrease of the resistance of the resistance-changing material 130 is predictable, and the repeatability of the resistance-changing material 130 switching between the low resistance state and the high resistance state is improved. Therefore, the reliability and stability of the resistive memory structure 100 is improved. Moreover, since the reactive layer 110 extends to form a plane, the ions (e.g. oxygen ions) in the resistance-changing material 130 may be sufficiently absorbed by the reactive layer 110 without being quickly saturated in the resistance-changing material 130. Therefore, the predictability, repeatability, and stability of the formation of the single filament 60 are improved.

In this embodiment, the electrode 120 is a conductive line extending along the third direction D3. Moreover, in this embodiment, the width of the electrode 120 (e.g. the width along the direction D2) is less than each of the width of the reactive layer 110 (e.g. the width along the direction D2) and the width of the resistance-changing material 130 (e.g. the width along the direction D2). In this embodiment, the thickness of the reactive layer 110 is less than the thickness of each of the metal layers 140 and 150. For example, the width of the electrode 120 ranges from 20 nm to 200 nm, and the thickness of the reactive layer 110 ranges from 1 nm to 30 nm. As a result, the portion of the resistance-changing material 130 where the electrode 120 crosses over the reactive layer 110 has an area small enough, so that the formation of a single filament 60 may be ensured.

Besides, the electrode 120, the metal layer 140, or the metal layer 150 may be coupled to a current limiter to limiting the current flows through the resistance-changing material 130 or coupled to a transistor. Moreover, in this embodiment, the electrode 120 is encapsulated in the resistance-changing material 130. In this embodiment, one side switching of the resistance-changing material 130 is achieved.

Figure 2C:
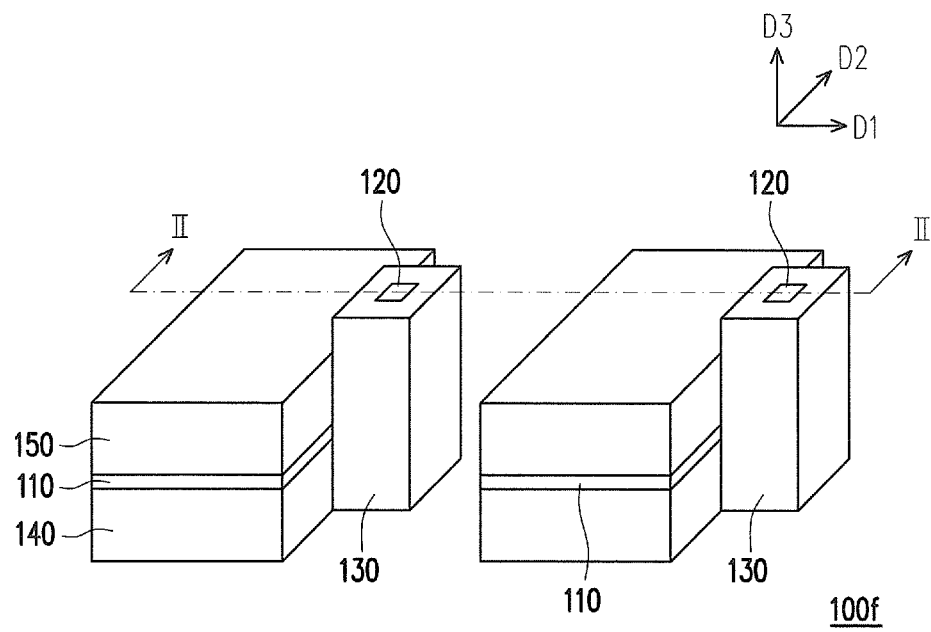
FIG. 2C is a schematic perspective view of a part of a resistive memory structure according to another exemplary embodiment.
Figure 2D:
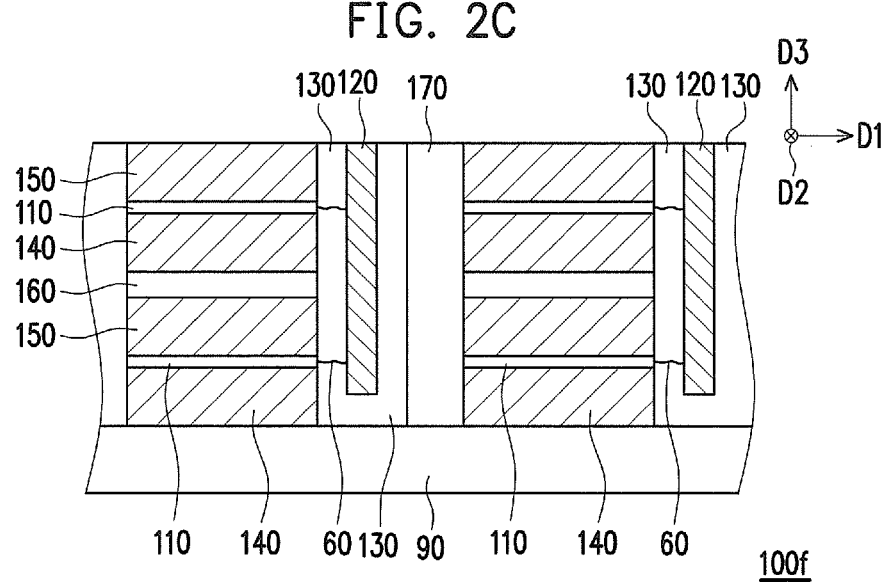
FIG. 2D is a schematic cross-sectional view of the resistive memory structure in FIG. 2C alone line II-II.

FIG. 2C is a schematic perspective view of a part of a resistive memory structure according to another exemplary embodiment, and FIG. 2D is a schematic cross-sectional view of the resistive memory structure in FIG. 2C alone line II-II. Referring to FIGS. 2C and 2D, the resistive memory structure 100f in this embodiment is similar to the resistive memory structure 100 in FIGS. 2A and 2B, and the difference therebetween is as follows. In this embodiment, the resistive memory structure 100f has a plurality of electrodes 120, and the sandwich structures formed with the reactive layer 110 and the metal layers 140 and 150 are also arranged laterally. The sidewalls of reactive layer 110 and the metal layers 140 and 150 may also be oxidized, for the purpose of forming desired barriers. For example, the sandwich structures are also arranged along at least one of the first direction D1 and the second direction D2. Moreover, the electrodes 120 may be arranged laterally. For example, the electrodes 120 may be arranged along at least one of the first direction D1 and the second direction D2. In this embodiment, the sandwich structures and the electrodes 120 are arranged alternately and laterally. Besides, an insulation structure 170 may be disposed between and isolate a resistance-changing material 130 and the adjacent sandwich structure not contacting the resistance-changing material 130.

Figure 3:
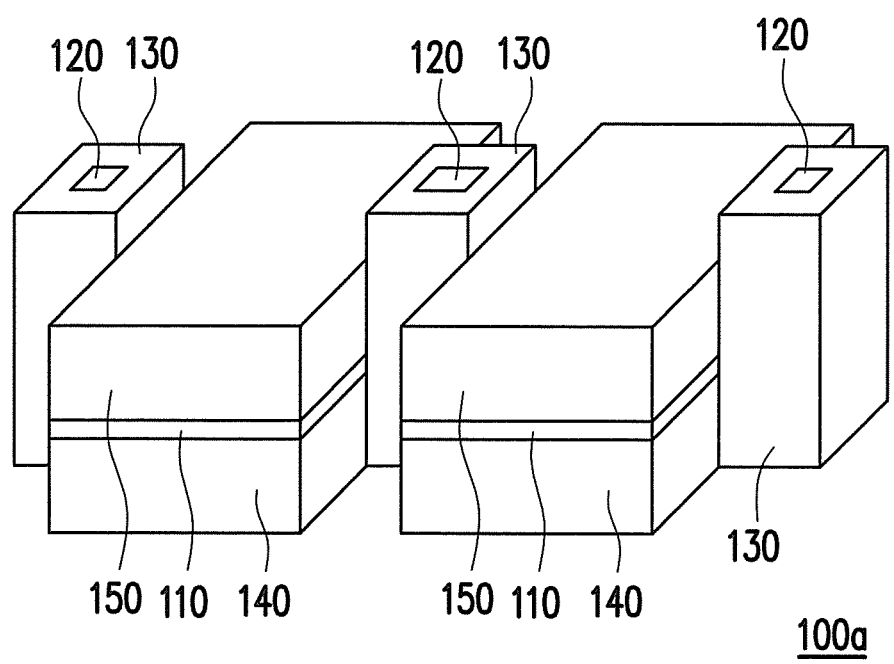
FIG. 3 is a schematic perspective view of a part of a resistive memory structure according to another exemplary embodiment.

FIG. 3 is a schematic perspective view of a part of a resistive memory structure according to another exemplary embodiment. Referring to FIG. 3, the resistive memory structure 100a according to this embodiment is similar to the resistive memory structure 100f in FIG. 2C, and the difference therebetween is as follows. In the resistive memory structure 100f, one resistance-changing material 130 is disposed beside and connects one reactive layer 110. However, in the resistive memory structure 100a according to this embodiment, each of the reactive layers 110 is disposed between and connects two adjacent resistance-changing materials 130. In this embodiment, each of the electrodes 120 is encapsulated in one of the resistance-changing materials 130. For example, each of the resistance-changing material 130 in FIG. 3 wraps five sides of the electrode 120. In this embodiment, both side switching of the resistance-changing material 130 is used, and the space utilization is improved. That is to say, the volume of the resistive memory structure 100a may be reduced, or the density of the RRAMs is increased.

Figure 4A:
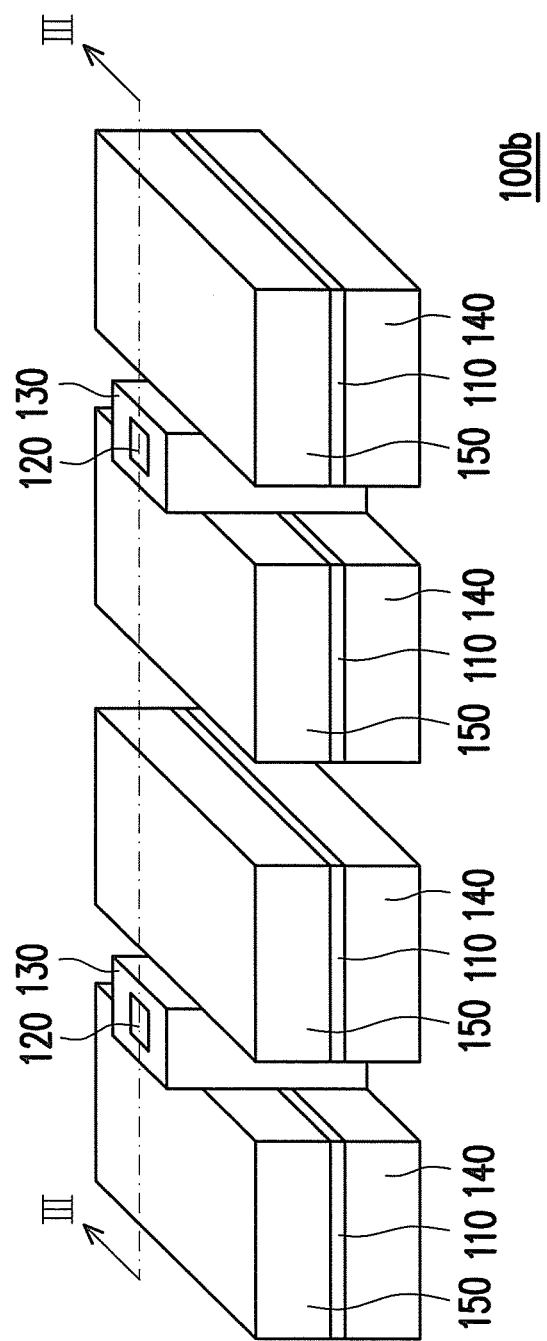
FIG. 4A is a schematic perspective view of a part of a resistive memory structure according to yet another exemplary embodiment.
Figure 4B:
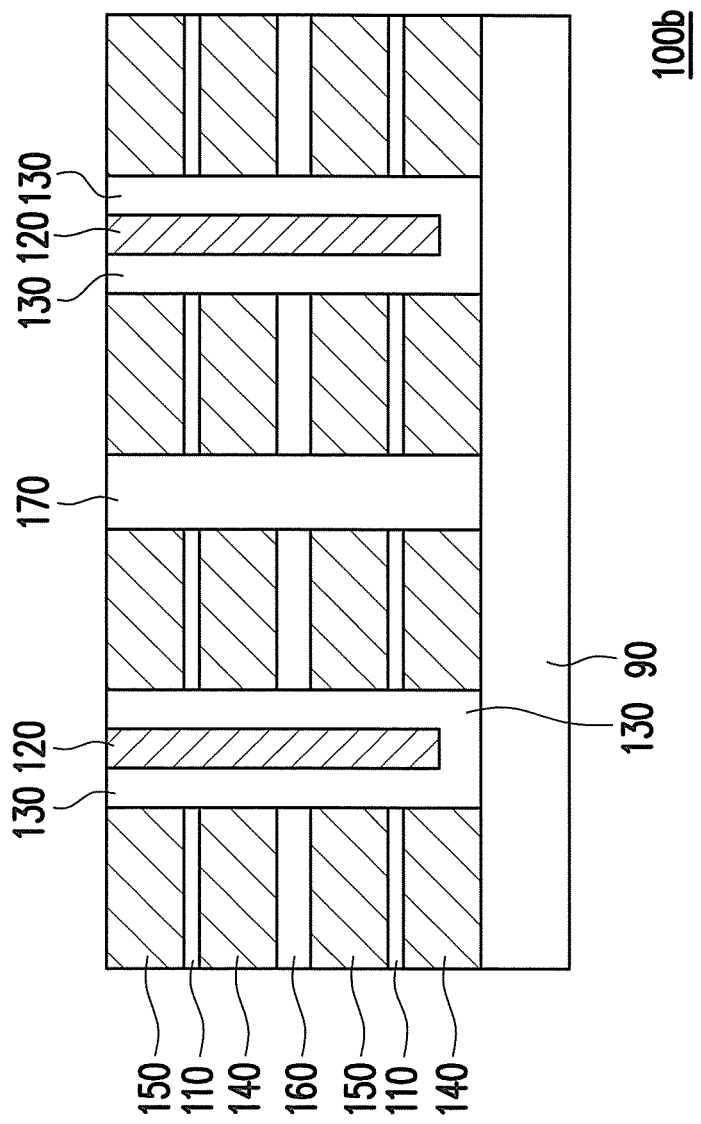
FIG. 4B is a schematic cross-sectional view of the resistive memory structure in FIG. 4A alone line II-II.

FIG. 4A is a schematic perspective view of a part of a resistive memory structure according to yet another exemplary embodiment, and FIG. 4B is a schematic cross-sectional view of the resistive memory structure in FIG. 4A alone line III-III. Referring to FIGS. 4A and 4B, the resistive memory structure 100b according to this embodiment is similar to the resistive memory structure 100a shown in FIG. 3, and the difference therebetween is as follows. In the resistive memory structure 100b according to this embodiment, each of the resistance-changing materials 130 is disposed between and contacts a pair of reactive layers 110. Moreover, in this embodiment, each of the electrodes 120 is encapsulated in one of the resistance-changing materials 130. Additionally, in this embodiment, the insulation structure 170 is disposed two adjacent sandwich structures. In this embodiment, one side switching of the resistance-changing material 130 is achieved, and the space utilization is also improved.

Figure 5:
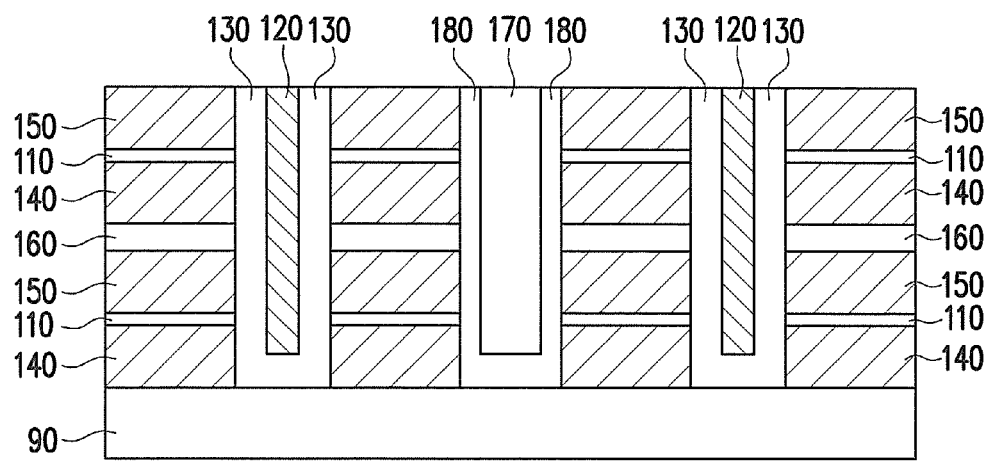
FIG. 5 is a schematic cross-sectional view of a resistive memory structure according to another exemplary embodiment.

FIG. 5 is a schematic cross-sectional view of a resistive memory structure according to another exemplary embodiment. Referring to FIG. 5, the resistive memory structure 100c in this embodiment is similar to the resistive memory structure 100b in FIG. 4B, and the main difference therebetween is as follows. In the resistive memory structure 100c in this embodiment, an encapsulation structure 180 is disposed between the adjacent insulation structure 170 and the adjacent sandwich structure to improve the insulation property of the insulation structure 170. The material of the insulation structure 170 is, for example, an oxide, and the material of the encapsulation structure 180 is, for example, a nitride.

Figure 6A:
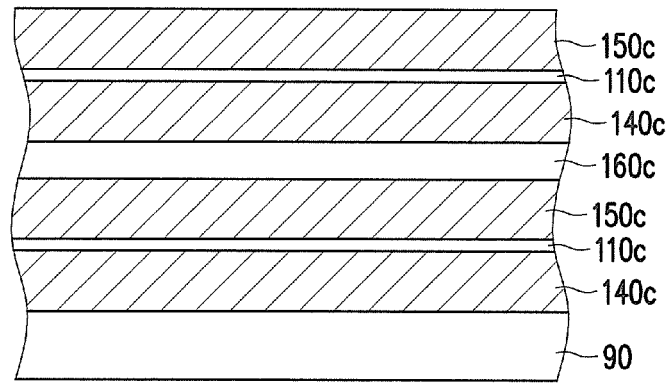
FIGS. 6A and 6B are schematic cross-sectional views showing the steps of a manufacturing method of the resistive memory structure according to an exemplary embodiment.
Figure 6B:
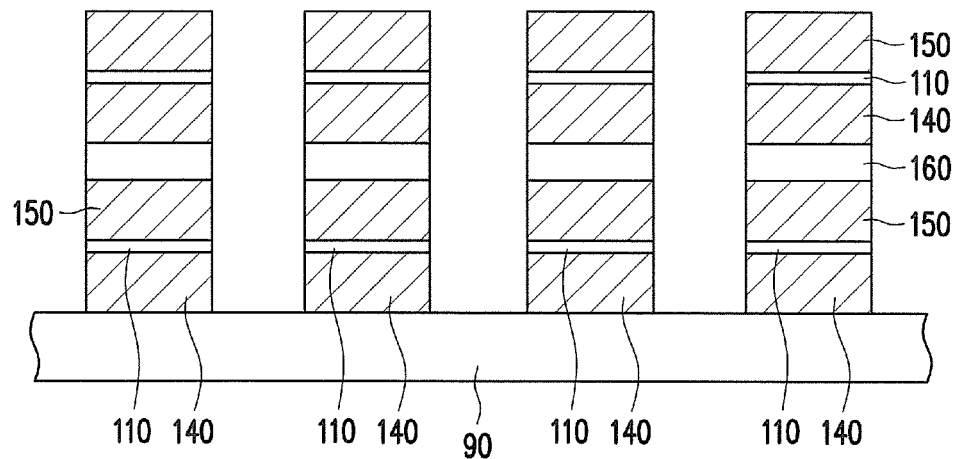

FIGS. 6A, 6B, and 5 are schematic cross-sectional views showing the steps of a manufacturing method of the resistive memory structure according to an exemplary embodiment. Referring to FIGS. 6A, 6B, and 5, the manufacturing method of the resistive memory structure in this embodiment may be applied to the above resistive memory structures 100, 100f, 100a, 100b, and 100c, and the resistive memory structure 100c is taken as an example herein to show the manufacturing method. The manufacturing method according to this embodiment comprises the following steps. First, as shown in FIG. 6A, a substrate 90 is provided. The substrate 90 is, for example, a silicon substrate or a substrate with any other suitable material. Then, a metal layer 140c, a reactive layer 110c, and a metal layer 150c are formed on the substrate 90 in sequence to form a sandwich structure. Then, the sandwich structures and insulation layers 160c may be formed alternately on the substrate 90, wherein two sandwich structures and one insulation layer 160c are exemplarily shown in FIG. 6A. The formation of these layers may be performed by chemical vapor deposition (CVD) or physical vapor deposition (PVD). Next, referring to FIG. 6B, part of these layers is etched, and the remaining part of these layers forms the metal layers 140, the reactive layers 110, the metal layers 150, and the insulation layer 160 as shown in FIG. 5. The sidewalls of the reactive layers 110 and metal layers 140 and 150 may be oxidized to form desired barriers. After that, referring to FIG. 5, the resistance-changing materials 130 and the electrodes 120 are formed beside the stacks of the metal layers 140, the reactive layers 110, and the metal layers 150. The formation of the resistance-changing materials 130 and the electrodes 120 may be performed by CVD or PVD and performed by photolithography. Moreover, referring to FIG. 5, the insulation structure 170 and the encapsulation structure 180 are formed between a resistance-changing material 130 and the adjacent sandwich structure not contacting the resistance-changing material 130.

In this embodiment, the manufacturing method forms a small area of the resistance-changing material 130 where the electrode 120 crosses over the reactive layer 110 by forming the electrode 120 and the reactive layer 110 extending along different directions, so that the structure of a small area between two electrodes may be achieved without the formation of a tip structure of the electrodes. The inclusion of desired interface barriers is also straightforward. As a result, the stability, the reliability and the yield of the manufacturing method in this embodiment are improved. Moreover, the manufacturing methods for the embodiments of FIGS. 2A-2B, 2C-2D, 3 and 4A-4B may also be performed by modifying the etching process of the metal layer 140c, the reactive layer 110c, and the metal layer 150c in FIG. 6A, and by modifying the photolithography process of the resistance-changing materials 130 and the electrodes 120.

Figure 7A:
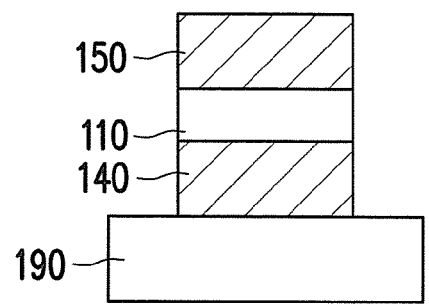
FIGS. 7A through 7C are schematic cross-sectional views showing the steps of a manufacturing method of the resistive memory structure according to another exemplary embodiment.
Figure 7B:
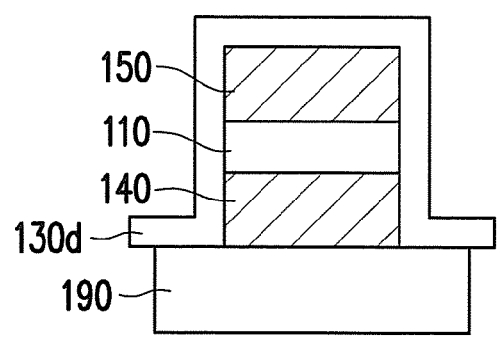
Figure 7C:
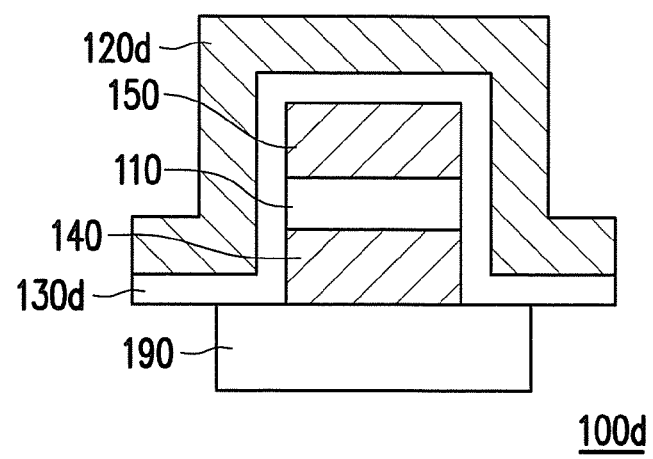
Figure 8:
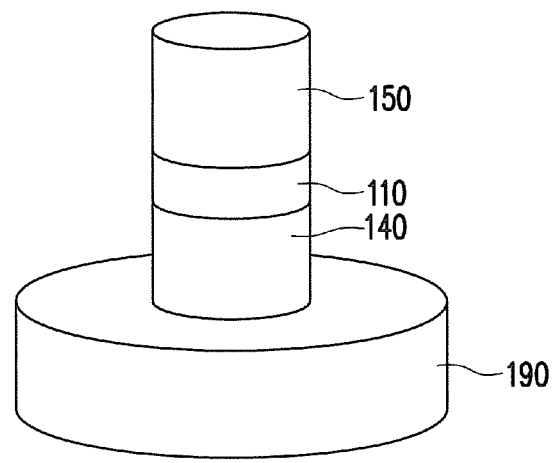
FIG. 8 is a perspective view of the electrode and the sandwich structure in FIG. 7A.

FIGS. 7A through 7C are schematic cross-sectional views showing the steps of a manufacturing method of the resistive memory structure according to another exemplary embodiment, and FIG. 8 is a perspective view of the electrode and the sandwich structure in FIG. 7A. Referring to FIGS. 7A through 7C and 8, the resistive memory structure 100d and the manufacturing method thereof are similar to the resistive memory structure 100c and the manufacturing method thereof showing in FIGS. 5, 6A, and 6B, and the main difference therebetween is as follows. The manufacturing method of the resistive memory structure 100d in this embodiment comprises the following step. First, referring to FIGS. 7A and 8, a metal layer 140, a reactive layer 110, and a metal layer 150 are formed on an electrode 190 in sequence. The sidewall of the reactive layer 110 and the metal layers 140 and 150 may be oxidized to form desired barriers. The electrode 190 is, for example, a bottom electrode. Then, referring to FIG. 7B, a resistance-changing material 130d is formed on the electrode 190 and the sandwich structure comprising the metal layer 140, the reactive layer 110, and the metal layer 150, and wraps the sandwich structure. In this embodiment, the resistance-changing material 130d contacts the side wall of the reactive layer 110. Moreover, the resistance-changing material 130d may surround the side wall of the metal layer 140, the side wall of the reactive layer 110, and the side wall of the metal layer 150. After that, referring to FIG. 7C, the electrode 120d is formed on the resistance-changing material 130d. In this embodiment, the electrode 120d is a conductive layer covering the resistance-changing material 130d. The resistive memory structure 100d may be used as an embedded memory which may be formed with few process steps added.

Figure 9:
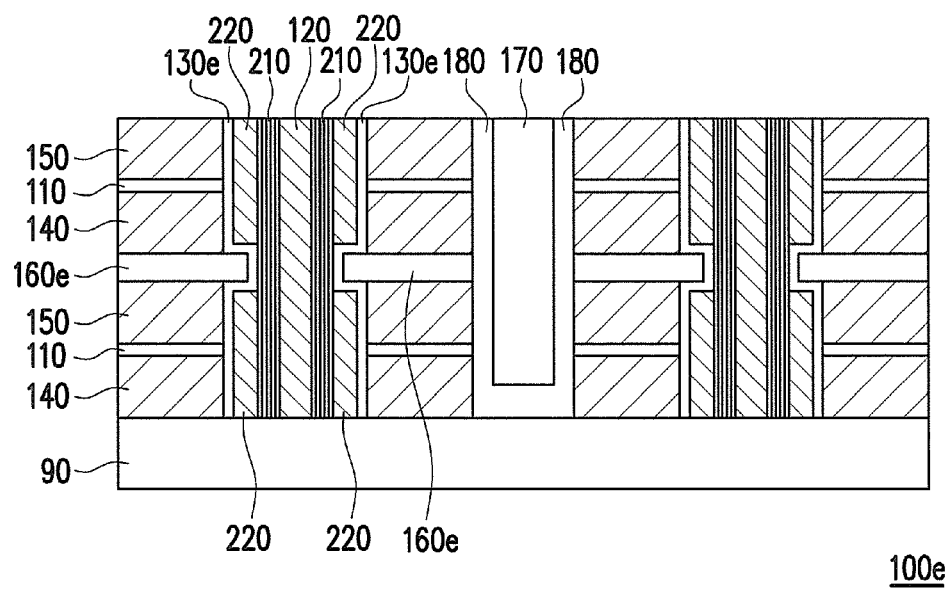
FIG. 9 is a schematic cross-sectional view of a resistive memory structure according to another exemplary embodiment.
Figure 10A:
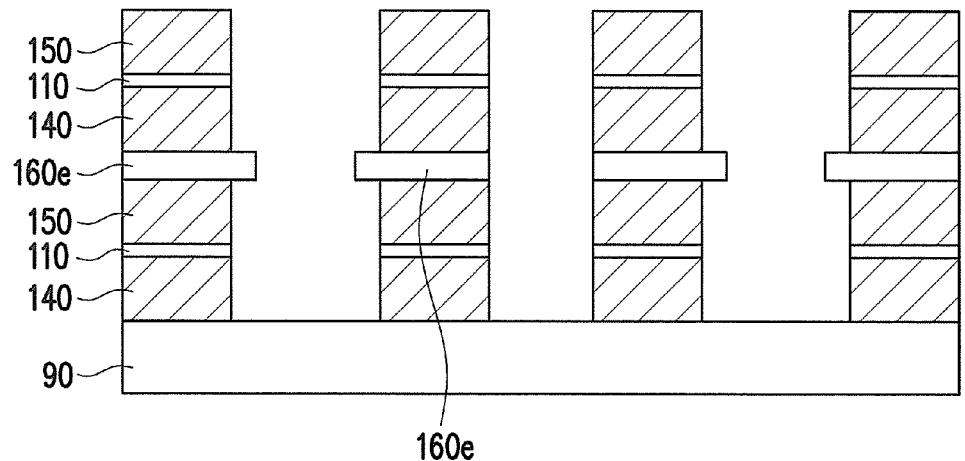
FIGS. 10A and 10B are schematic cross-sectional views showing the steps of a manufacturing method of the resistive memory structure in FIG. 9.
Figure 10B:
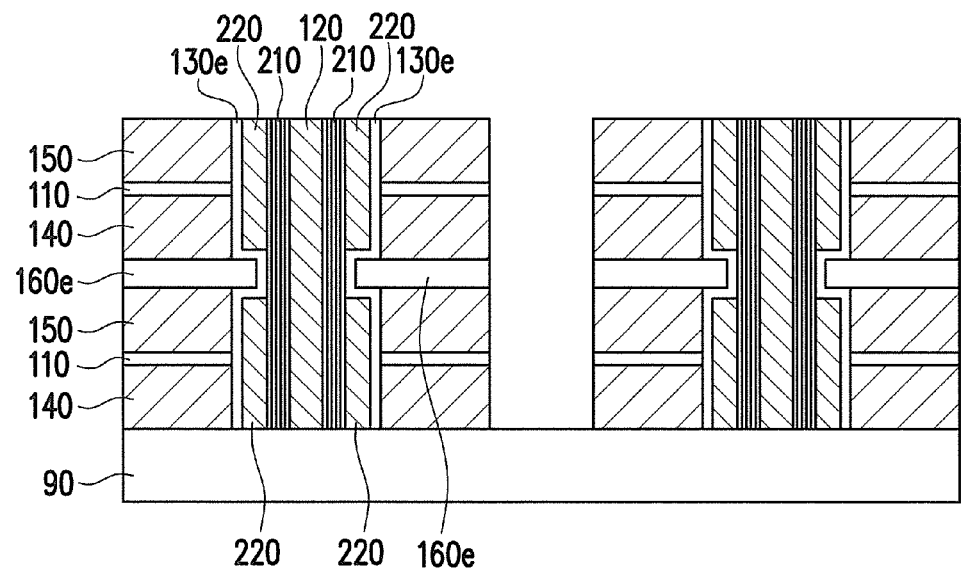

FIG. 9 is a schematic cross-sectional view of a resistive memory structure according to another exemplary embodiment, and FIGS. 10A, 10B, and 9 are schematic cross-sectional views showing the steps of a manufacturing method of the resistive memory structure in FIG. 9. Referring to FIG. 9 first, the resistive memory structure 100e in this embodiment is similar to the resistive memory structure 100c in FIG. 5, and the main difference therebetween is as follows. In the resistive memory structure 100e, there is a middle electrode 220 disposed between each sandwich structure and the electrode 120 and between the resistance-changing material 130e and the electrode 120. Moreover, in this embodiment, there is a switch layer 210 disposed between the electrode 120 and the middle electrodes 220 and between the resistance-changing material 130e and the electrode 120. The middle electrodes 220 are, for example, metal electrodes. In this embodiment, the material of the middle electrode 220 may be titanium nitride (TiN), titanium (Ti), tantalum (Ta), tungsten (W), or any combination thereof. The switch layer 210 is, for example, one or any combination of a Schottky barrier layer, a tunnelling barrier layer, and an ion motion layer. The material of the switch layer 210 may be a single layer of or any combination of layers of oxide, chalcogenide, and semiconductor. The switch layer 210 may be switched to a conductive state or to a non-conductive state. When the switch layer 210 is switched to the conductive state, a conductive path is formed between the middle electrode 220 and the electrode 120. When the switch layer 210 is switched to the non-conductive state, the middle electrode 220 is insulated from the electrode 120. Moreover, Zener effect in doped semiconductor may be used for the switching of the switch layer 210. In this embodiment, the material of the switch layer 210 is, for example, a composite layers of $TaO_x$, $TiO_y$, and $TaO_z$, wherein the $TiO_x$ layer is disposed between the $TaO_x$ layer and the $TaO_z$ layer, x>0, y>0, and z>0.

The switch layers 210 in this embodiment facilitate the respective control of the states of the resistance-changing materials 130e between the electrodes 120 and the reactive layers 110. Moreover, in this embodiment, the density of RRAMs is improved, and the leakage power of the resistive memory structure is also reduced.

Referring to FIGS. 10A, 10B, and 9, in this embodiment, the manufacturing method of the resistive memory structure 100e is similar to the manufacturing method of the resistive memory structure 100c shown in FIGS. 6A, 6B, and 5. In the manufacturing method in this embodiment, the metal layers 140c and 150c, the reactive layers 110c, and the insulation layer 160c are formed in the substrate 90, as shown in FIG. 6A. The main difference between the manufacturing method in this embodiment and the manufacturing method in FIGS. 6A, 6B, and 5 is as follows. Referring to FIG. 10A, parts of the metal layers 140c and 150c, the reactive layers 110c, and the insulation layer 160c are then etched, and the remaining parts form the metal layers 140 and 150, the reactive layers 110, and the insulation layer 160e, wherein the insulation layer 160e protrudes laterally with respect to the sandwich structure. After that, referring to FIG. 10B, a resistance-changing material 130e is formed on the side wall of the sandwich structure, wherein the resistance-changing material 130e covers the lateral protrusion portion of the insulation layer 160c. Next, a plurality of middle electrodes 220 are respective formed on the side wall of the sandwich structures, wherein the resistance-changing material 130e connects the middle electrodes 220 and the sandwich structure, and the lateral protrusion portion of the insulation layer 160c separates two adjacent middle electrodes 220 arranged vertically. Afterwards, a switch layer 210 is formed on the side wall of the middle electrodes 220 and the lateral protrusion portion of the insulation layer 160c. Then, an electrode 120 is formed beside the switch layer 210. Then, referring to FIG. 9, the encapsulation structure 180 is formed on the side wall of the sandwich structures and the insulation layer 160e, and the insulation structure 170 is then formed beside the encapsulation structure 180.

In conclusion, in the resistive memory structure according to the embodiments of the disclosure, since the electrode and the reactive layer extend along different directions, the portion of the resistance-changing material where the electrode crosses over the reactive layer has a small area. As a result, the decrease of the resistance of the resistance-changing material is predictable, and the repeatability of the resistance-changing material switching between the low resistance state and the high resistance state is improved. Therefore, the reliability and stability of the resistive memory structure are improved. Moreover, since the reactive layer extends to form a plane, the ions in the resistance-changing material may be sufficiently absorbed by the reactive layer without being quickly saturated in the resistance-changing material. Therefore, the predictability, repeatability, and stability of the formation of the filament in the resistance-changing material are improved. Besides, in the embodiments of the disclosure, the manufacturing method of the resistive memory structure forms a small area of the resistance-changing material where the electrode crosses over the reactive layer by forming the electrode and the reactive layer extending along different directions, so that the structure of a small area between two electrodes may be achieved without the formation of a tip structure of the electrodes. As a result, the stability, the reliability and the yield of the manufacturing method of the resistive memory are improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A resistive memory structure comprising:
   at least one reactive layer extending along a first direction and a second direction;
   at least one electrode extending at least along a third direction, wherein the first direction, the second direction, and the third direction are different from each other; and
   at least one resistance-changing material, at least part of the resistance-changing material being disposed between the reactive layer and the electrode, wherein when ions diffuse from the resistance-changing material to the reactive layer or from the reactive layer to the resistance-changing material, resistance of the resistance-changing material changes.

2. The resistive memory structure according to claim 1, wherein the reactive layer is a reactive metal layer.

3. The resistive memory structure according to claim 2, wherein a material of the reactive metal layer comprises Ti, Ta, or a combination thereof.

4. The resistive memory structure according to claim 1 wherein the at least one reactive layer is included among a plurality of metal layers.

5. The resistive memory structure according to claim 4, wherein sidewalls of the metal layers are oxidized.

6. The resistive memory structure according to claim 4, wherein a material of the metal layers comprises TiN, TaN, Ti, W, Al, Ta or a combination thereof.

7. The resistive memory structure according to claim 1, wherein the resistance-changing material is an oxide.

8. The resistive memory structure according to claim 7, wherein the resistance-changing material comprises $HfO_2$, $SiO_2$, $TiO_2$, TaO, or $Al_2O_3$.

9. The resistive memory structure according to claim 7, wherein the reactive layer is an oxygen ion getter.

10. The resistive memory structure according to claim 1, wherein the electrode is encapsulated in the resistance-changing material.

11. The resistive memory structure according to claim 1, wherein a material of the electrode comprises TiN, W, Ti, or a combination thereof.

12. The resistive memory structure according to claim 1, wherein the at least one reactive layer is a plurality of reactive layers, the at least one electrode is a plurality of electrodes, the at least one resistance-changing material is a plurality of resistance-changing materials, each of the reactive layers is disposed between and connects two adjacent resistance-changing materials.

13. The resistive memory structure according to claim 12, wherein each of the electrodes is encapsulated in one of the resistance-changing materials.

14. The resistive memory structure according to claim 1, wherein the at least one of the reactive layers is a plurality of pairs of reactive layers, the at least one electrode is a plurality of electrodes, the at least one resistance-changing material is a plurality of resistance-changing materials, and each of the resistance-changing materials is disposed between and contacts a pair of reactive layers.

15. The resistive memory structure according to claim 14, wherein each of the electrodes is encapsulated in one of the resistance-changing materials.

16. The resistive memory structure according to claim 14 further comprising:
    a middle electrode disposed between each of the reactive layers and the electrode; and
    a switch layer disposed between the middle electrode and the electrode.

17. The resistive memory structure according to claim 1, wherein the first direction, the second direction, and the third direction are substantially perpendicular to each other.

18. The resistive memory structure according to claim 1, wherein the electrode is a conductive line extending along the third direction.

19. The resistive memory structure according to claim 18, wherein a width of the conductive line is less than each of a width of the reactive layer and a width of the resistance-changing material.

20. The resistive memory structure according to claim 1, wherein the resistance-changing material surrounds a side wall of the reactive layer, and the electrode covers the resistance-changing material.

* * * * *